US009224450B2

(12) United States Patent
Cordero et al.

(10) Patent No.: US 9,224,450 B2
(45) Date of Patent: Dec. 29, 2015

(54) REFERENCE VOLTAGE MODIFICATION IN A MEMORY DEVICE

(71) Applicant: International Business Machines Corporation, Armonk, NY (US)

(72) Inventors: Edgar R. Cordero, Round Rock, TX (US); Joab D. Henderson, Pflugerville, TX (US); Kyu-hyoun Kim, Mount Kisco, NY (US); Jeffrey A. Sabrowski, Leander, TX (US); Anuwat Saetow, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/889,528

(22) Filed: May 8, 2013

(65) Prior Publication Data
US 2014/0334224 A1    Nov. 13, 2014

(51) Int. Cl.
G11C 7/00         (2006.01)
G11C 11/406     (2006.01)
G11C 11/4099   (2006.01)

(52) U.S. Cl.
CPC .......... *G11C 11/406* (2013.01); *G11C 11/4099* (2013.01)

(58) Field of Classification Search
USPC ......................................... 365/222, 210, 206
See application file for complete search history.

(56) References Cited

U.S. PATENT DOCUMENTS

| | | | |
|---|---|---|---|
| 5,495,452 A | 2/1996 | Cha | |
| 5,717,644 A | 2/1998 | Hadderman et al. | |
| 5,737,271 A | 4/1998 | Ting et al. | |
| 6,097,649 A * | 8/2000 | Chiang et al. | 365/203 |
| 6,714,469 B2 * | 3/2004 | Rickes et al. | 365/201 |
| 6,778,457 B1 | 8/2004 | Burgan | |
| 7,142,473 B2 * | 11/2006 | Ogiwara et al. | 365/211 |
| 7,272,065 B2 | 9/2007 | Lovett | |
| 7,304,881 B2 * | 12/2007 | Rodriguez et al. | 365/145 |
| 7,359,247 B2 * | 4/2008 | Motoki | 365/185.2 |
| 7,440,353 B2 * | 10/2008 | Kim et al. | 365/222 |
| 7,495,955 B2 * | 2/2009 | Ido | 365/185.02 |
| 7,813,205 B2 * | 10/2010 | Sako | 365/222 |
| 7,903,479 B2 | 3/2011 | Im | |

(Continued)

FOREIGN PATENT DOCUMENTS

JP         2005332497         12/2005

OTHER PUBLICATIONS

Cordero, F, et al., "Prioritizing Refreshes in a Memory Device" Filed May 8, 2013.

(Continued)

*Primary Examiner* — Huan Hoang
*Assistant Examiner* — Minh Dinh
(74) *Attorney, Agent, or Firm* — Nicholas D. Bowman; Robert R. Williams

(57) ABSTRACT

A method and apparatus for modifying a reference voltage between refreshes in a memory device are disclosed. The memory array may include a plurality of memory cells. The memory device may also include a sense amplifier. The sense amplifier may be configured to read data from the plurality of memory cells using a reference voltage. The memory device may also include a sense amplifier reference voltage modification circuit. The sense amplifier reference voltage modification circuit may be configured to detect a triggering event and modify the reference voltage in response to detecting a triggering event.

11 Claims, 7 Drawing Sheets

(56) References Cited

U.S. PATENT DOCUMENTS

| | | | |
|---|---|---|---|
| 8,111,574 B2 | 2/2012 | Kim | |
| 8,310,858 B2* | 11/2012 | Ito | 365/148 |
| 8,634,225 B2 | 1/2014 | Kang | |
| 8,737,120 B2 | 5/2014 | Guo et al. | |
| 2007/0171753 A1 | 7/2007 | Morgan et al. | |
| 2011/0051495 A1* | 3/2011 | Ito | 365/148 |
| 2011/0128774 A1* | 6/2011 | Maejima | 365/148 |
| 2011/0157962 A1* | 6/2011 | McElroy et al. | 365/149 |
| 2011/0286288 A1 | 11/2011 | Mutnury et al. | |
| 2012/0039133 A1 | 2/2012 | Kadowaki | |
| 2013/0304982 A1 | 11/2013 | Jung et al. | |
| 2014/0085995 A1* | 3/2014 | Greenfield et al. | 365/201 |

OTHER PUBLICATIONS

Nyathi, J. et al., "Self-Timed Refreshing Approach for Dynamic Memories", ASIC Conference Proceedings, 11th Annual IEEE International, 1998. pp. 169-173. http://ieeexplore.ieee.org/stampistamp.jsp?tp=&arnumber=722887.

Scheuerlein, R., et al., "A Pulsed Sensing Scheme with a Limited Bit-Line Swing", IEEE Journal of Solid-State Circuits. vol. 27, No. 4, Apr. 1992. Pages 678-682. http://ieeexplore.ieee.org/stamp/stamp.jsp?tp=&arnumber=126563.

Cordero et al., "Reference Voltage Modification in a Memory Device," U.S. Appl. No. 14/694,067, filed Apr. 23, 2015.

* cited by examiner

US 9,224,450 B2

REFERENCE VOLTAGE MODIFICATION IN A MEMORY DEVICE

FIELD

This disclosure generally relates to reference voltage modification, and in particular, to reference voltage modification between refreshes in a dynamic random access memory (DRAM).

BACKGROUND

A dynamic random access memory (DRAM) stores a bit of data on a capacitor in a DRAM cell. The capacitor loses its charge over time and must be periodically refreshed. The frequency with which a particular capacitor needs to be refreshed depends on the construction and manufacture of the chip. As devices continue to decrease in size, a DRAM cell may become discharged when its neighbor is accessed repeatedly in a short amount of time. Repeatedly accessing a row of the DRAM is sometimes referred to as row hammering. This behavior could lead to a loss of data in the affected DRAM cell. If, however, the affected cell is refreshed prior to losing its data, the cell will regain its charge and take a large number of accesses by its neighbor in order to be affected again. Conversely, if the affected cell is refreshed after losing its data, uncorrectable errors may occur.

SUMMARY

Embodiments of the disclosure provide a method and apparatus for modifying a reference voltage between refreshes in a memory device.

In one embodiment, a memory device including a memory array is described. The memory array includes a plurality of memory cells. The memory device may also include a sense amplifier. The sense amplifier may be configured to read data from the plurality of memory cells using a reference voltage. The memory device may also include a sense amplifier reference voltage modification circuit. The sense amplifier reference voltage modification circuit may be configured to detect a triggering event and modify the reference voltage in response to detecting a triggering event.

Another embodiment describes a method of modifying a reference voltage between refreshes in a memory device. The method may include determining whether a request to access a row of a memory array has been received. When a request to access the row of the memory array has been received, the method may modify the reference voltage to be used to read the row of the memory array when a time elapsed since a last refresh for the row is outside a threshold.

BRIEF DESCRIPTION OF THE DRAWINGS

Like reference numbers and designations in the various drawings indicate like elements.

DETAILED DESCRIPTION

Dynamic random access memory (DRAM) is made up of cells, referred to in this Specification as DRAM cells, which include a capacitor and a transistor. The capacitor in a DRAM cell may store a charge representing a bit of data. DRAM cells may leak charge over time. Accordingly, the DRAM must be periodically refreshed to prevent data loss caused by the charge leakage.

A DRAM cell may become discharged when a neighboring DRAM cell is accessed repeatedly in a short amount of time. This behavior could lead to data loss of the affected DRAM cell. In some embodiments, a reference voltage used to interpret the contents of the DRAM cell may be modified between refreshes. Consistent with embodiments of the present disclosure, modifying the reference voltage between refreshes may ensure that the correct value is read even though the DRAM cell has leaked some of its charge. The DRAM cell may, in some embodiments, leak charge because of the transistor, while in other embodiments the dielectric in the capacitor may cause the charge leakage. In some embodiments, the modification of the reference voltage may be based on one or more accesses to neighboring (adjacent) rows of cells in a DRAM array.

Figure 1:
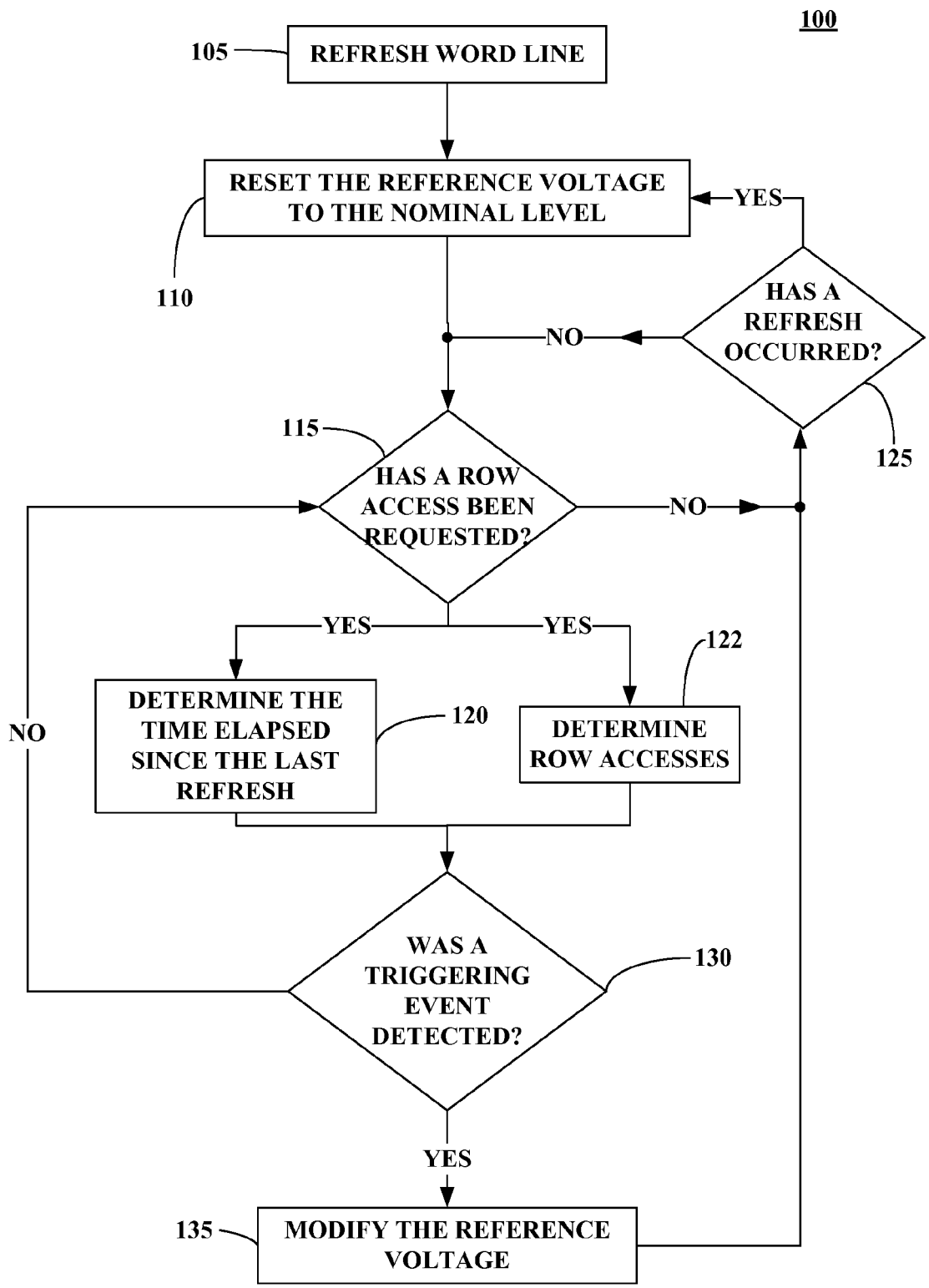
FIG. 1 illustrates a flowchart for a method to modify a reference voltage in a row of a dynamic random access memory (DRAM) between refreshes, according to various embodiments.

FIG. 1 illustrates a flowchart for a method 100 to modify a reference voltage between refreshes in a dynamic random access memory (DRAM), according to various embodiments. In a DRAM, a reference voltage may be used to determine whether a capacitor in a particular DRAM cell is storing a 1 or a 0. The reference voltage may be set according to a nominal value that provides desirable voltage margins relative to the voltages corresponding to the 1 and 0 values. This nominal voltage may be set according to a particular, expected leakage rate. Aspects of the present disclosure are based upon the recognition that, because the DRAM cell may leak charge, the nominal reference voltage may not be ideal (or even appropriate) for determining whether the DRAM cell stores a 1 or a 0. Accordingly, in some embodiments, the method 100 may modify the reference voltage to account for the charge leakage.

The method 100 may begin with operation 105, in which a row in a DRAM array is refreshed. Following the refresh of operation 105, the reference voltage to be used for interpreting a 1 and a 0 may be reset to its nominal level at operation 110. At operation 115, the method 100 may determine whether a row access has been requested. A "row access" as referred to in this Specification may include either a read or a write operation. Particular embodiments, however, could distinguish between read or write operations. If a row access has not been requested, then the method 100 may continue to operation 125. At operation 125, the method 100 may determine whether a refresh has occurred within a specified period of time prior to the row access request. If there has been a refresh, then the method 100 will again reset the reference voltage to the nominal level in operation 110. If a refresh has not occurred, then the method 100 will continue to determine whether a row access has been requested in operation 115. If operation 115 determines that a row access has been requested, then the method 100 may continue to operations 120 and 122.

At operation 120, the method 100 may determine the time elapsed since the last refresh. At operation 122, the method 100 may determine a voltage indicator, e.g., a voltage may be used to indicate whether a change in the reference voltage is needed. Some embodiments may include operation 120, while others may include operation 122 or both operations 120 and 122. Once the time elapsed since the last refresh and/or the voltage indicator has been determined, the method 100 may determine whether a triggering event was detected in operation 130. A triggering event may represent a potential change in the DRAM leakage rate and may be based on either adjacent row access activity or the time elapsed since the last refresh. The "refresh time threshold," as referred to in this Specification, may include an amount of time that is less than the refresh cycle period. For example, if the refresh cycle period is 64 milliseconds, then the refresh time threshold may be a time period that is less than 64 milliseconds. In some embodiments, there may be multiple refresh time thresholds. If the time elapsed since the last refresh is within the refresh time threshold, then a triggering event was not detected and the method 100 may return to operation 115 and continue monitoring for an access request. If, however, the time elapsed since the last refresh is outside the refresh time threshold then a triggering event was detected and the method 100 may continue to operation 135. Similarly, if the voltage indicator (explained in further detail below) is outside a threshold, then a triggering event was detected and the method 100 may continue to operation 135, otherwise the method 100 may continue to operation 115.

At operation 135 the method 100 may modify the reference voltage. The reference voltage may be modified to a lower reference voltage in some embodiments. In other embodiments, the reference voltage may be modified to a higher reference voltage. The modified reference voltage may be higher than the nominal reference voltage in embodiments where the leakage of the DRAM cells results in an increased voltage and lower than the nominal reference voltage in embodiments where the leakage of the DRAM cells results in a decreased voltage. In some embodiments, there may be a nominal reference voltage and a single modified reference voltage, while in other embodiments the reference voltage may be modified by a variable (e.g., step or continuous) amount each time the reference voltage is reduced prior to a refresh. That is, in some embodiments the reference voltage may be modified as a function of the number of accesses or time.

In some embodiments, there may be a voltage reference level boundary. The voltage reference level boundary may ensure that the reference voltage is not modified beyond the reference level boundary. Following operation 135 the method 100 may return to operation 125. FIGS. 2-7 illustrate various embodiments for implementing the method 100 in a DRAM.

Figure 2:
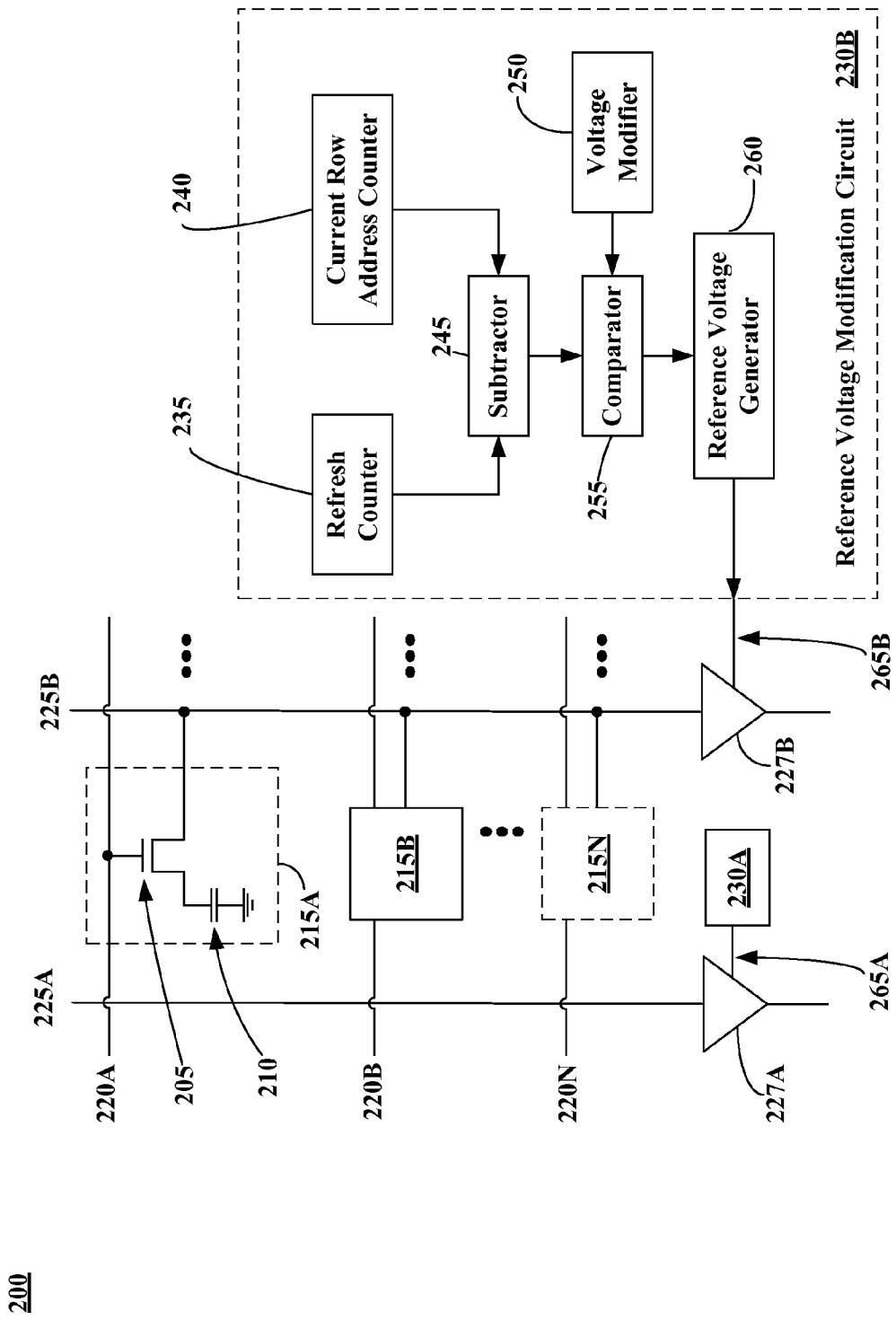
FIG. 2 illustrates a DRAM including a first embodiment of a reference voltage modification circuit.

FIG. 2 illustrates a first embodiment of a DRAM 200 including a reference voltage modification circuit, e.g., reference voltage modification circuit 230B. The DRAM 200 illustrates a reference voltage modification circuit that may modify a reference voltage to be used in a sense amplifier when reading or writing a DRAM cell. In some embodiments, the reference voltage modification circuit may raise the reference voltage above the nominal reference voltage. In other embodiments, the reference voltage modification circuit may lower the reference voltage below the nominal reference voltage. The modification from the nominal reference voltage may be determined by the direction of the leakage for the DRAM cells, which may vary depending upon the particular technology.

The DRAM 200 includes a plurality of DRAM cells 215A-215N, generically referred to in this Detailed Description as DRAM cells 215. Each of the DRAM cells 215 includes one transistor 205 and one capacitor 210. The capacitor 210 may be charged or discharged to represent either a 1 or a 0. The DRAM 200 is arranged in an array of DRAM cells 215. Word lines 220A-220N, generically referred to in this Detailed Description as word lines 220, connect each row. Bit lines 225A-225B, generically referred to in this Detailed Description as bit lines 225, connect each column of the array of DRAM cells 215. The array of DRAM cells 215 including word lines 220 and bit lines 225 are exemplary and may include additional DRAM cells 215, word lines 220, and bit lines 225. Sense amplifiers 227A-227B, generically referred to in this Detailed Description as sense amplifiers 227, correspond to each of the bit lines 225. The sense amplifiers 227 may be used to compare a reference voltage (provided by reference voltage lines 265A and 265B, referred to generically in this Detailed Description as reference voltage line 265) with the voltage of a capacitor, e.g., capacitor 210, of one of the DRAM cells 215 to determine whether the capacitor is storing a 1 or a 0. Reference voltage modification circuits 230A and 230B, referred to generically in this Detailed Description as reference voltage modification circuits 230, provide the reference voltage to the sense amplifiers 227 via reference voltage line 265. The reference voltage provided may be either a nominal reference voltage or a modified reference voltage, according to various embodiments.

The reference voltage modification circuit 230 may include a refresh counter 235, a current row address counter 240, a subtractor 245, a voltage modifier 250, a comparator 255, and a reference voltage generator 260, according to various embodiments. The refresh counter 235 may identify the current refresh address. The current row address counter 240 may indicate the current row address for which an access has been requested. The subtractor 245 may use the current refresh address and the current row address to determine the time that has elapsed since the last refresh was completed for the particular row. The voltage modifier 250 may provide one or more voltage modification steps. The one or more voltage modification steps may provide a modified reference voltage in some embodiments. In other embodiments, the voltage modifier 250 may provide a voltage amount by which to modify the reference voltage. The voltage modifier 250 may include a threshold reference voltage which provides a boundary amount beyond which the reference voltage may not be modified. The comparator 255 may determine whether the time that has elapsed since the last refresh (as determined by the subtractor 245) is outside a refresh time threshold. If the time elapsed since the last refresh is determined to be outside the refresh time threshold, then the reference voltage generator 260 may provide a modified reference voltage to the reference voltage line 265 based on the voltage modification steps of the voltage modifier 250. If, however, the time elapsed since the last refresh is within the refresh time threshold, the reference voltage generator 260 may provide the nominal reference voltage to the reference voltage line 265.

Figure 3:
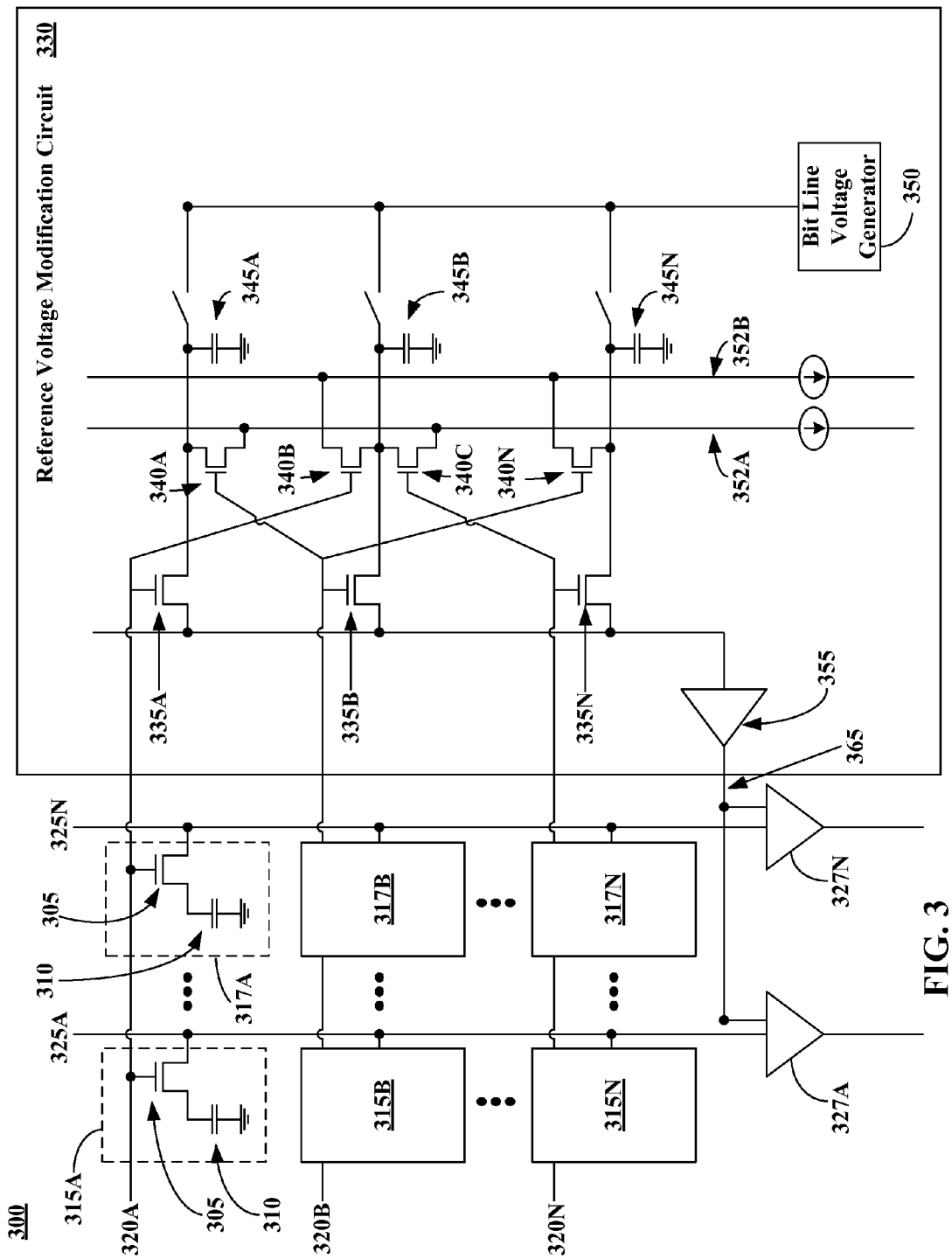
FIG. 3 illustrates a DRAM including a second embodiment of a reference voltage modification circuit.

FIG. 3 illustrates a second embodiment of a DRAM 300 including a reference voltage modification circuit, e.g., reference voltage modification circuit 330. The DRAM 300 illustrates the reference voltage modification circuit that may modify the reference voltage to be used in a sense amplifier when reading or writing a DRAM cell. In some embodiments, the reference voltage modification circuit may raise the reference voltage above the nominal reference voltage. In other embodiments, the reference voltage modification circuit may lower the reference voltage below the nominal reference voltage. The modification from the nominal reference voltage may be determined by the direction of the leakage for the DRAM cells, which may vary depending upon the particular technology.

The DRAM 300 includes a plurality of DRAM cells 315A-315N, 317A-317N, generically referred to in this Detailed Description as the DRAM cells 315 and DRAM cells 317. Each of the DRAM cells 315 and 317 includes one transistor 305 and one capacitor 310. The capacitor 310 may be charged or discharged to represent either a 1 or a 0. The DRAM 300 is arranged in an array of DRAM cells 315 and 317. Word lines 320A-320N, generically referred to in this Detailed Description as word lines 320, connect each row. Bit lines 325A-325N, generically referred to in this Detailed Description as bit lines 325, connect each column of the array of DRAM cells 315, 317. The array of DRAM cells 315, 317 including word lines 320 and bit lines 325 are exemplary and may include additional DRAM cells 315, 317, word lines 320, and bit lines 325. Sense amplifiers 327A-327N, generically referred to in this Detailed Description as sense amplifiers 327, correspond to each of the bit lines 325. The sense amplifiers 327 may be used to compare a reference voltage with the voltage of a capacitor, e.g., capacitor 310, of one of the DRAM cells 315, 317 to determine whether the capacitor 310 is storing a 1 or a 0. A reference voltage modification circuit 330 provides the reference voltage to the sense amplifiers 327 via reference voltage line 365.

The reference voltage modification circuit 330 may include transistors 335A-335N, generically referred to in this Detailed Description as transistors 335, negative channel field-effect transistors (NFETs) 340A-340N, generically referred to in this Detailed Description as NFETs 340, tank capacitors 345A-345N, a bit line voltage generator 350, two current sources 352A and 352B, and a unity gain buffer 355. The reference voltage modification circuit 330 provides a reference voltage to the sense amplifiers 327 via reference voltage line 365. The reference voltage line 365 may provide a nominal reference voltage or a modified reference voltage, according to various embodiments. In the illustrated embodiment, the current sources 352A and 352B and the bit line voltage generator 350 are shown on a per chip basis for the DRAM 300. In other embodiments, the bit line voltage generator 350 and the current sources 352A and 352B may be implemented on a per row group basis. That is, there could be individual current sources and bit line voltage generators for groups of rows in the DRAM 300.

Each word line 320 is coupled to a transistor 335, at least one NFET 340, and a tank capacitor 345. In some embodiments, the NFET 340 may be implemented using a positive field-effect transistor (PFET) instead. Word line 320B, for example, is coupled to transistor 335B, NFETs 340A and 340N, and tank capacitor 345B. The remaining word lines 320 are configured the same as or similar to the word line 320B. The reference voltage modification circuit 330 may provide a modified reference voltage via the reference voltage line 365 in some embodiments. The reference voltage modification circuit 330 may account for charge leakage that occurs due to a large number of row accesses on an adjacent row. For example, if word line 320A is accessed a large number of times in a short period of time, e.g., between refresh cycles, the DRAM cells 315 and 317 connected to word line 320B may leak more charge than if no accesses occurred to word line 320A. Accordingly, when accessing a DRAM cell 315 or 317 connected to word line 320B, the reference voltage may not be the correct value for interpreting the value stored in the DRAM cells 315 and 317.

The reference voltage modification circuit 330 may be configured to modify the reference voltage. When a row is accessed, the capacitors 345 may be charged using the bit line voltage generator 350 to a nominal reference voltage. When a row is accessed, e.g., word line 320B, the NFETs 340 for the adjacent rows to which that word line is connected will allow for some charge to be drained from the corresponding capacitor. For example, when word line 320B is accessed, then NFETs 340A and 340N would allow some charge to drain from capacitors 345A and 345N. Accordingly, when the word line 320B is used to access the corresponding row of DRAM cells, e.g., 315B, 317B, the transistor 335B will allow for the charge in the capacitor 345B (which may have a corresponding voltage that is reduced from the nominal reference voltage) to flow through the unity gain buffer 355 to the sense amplifiers 327. Accordingly, the reference voltage supplied to the sense amplifiers 327 via the reference voltage line 365 may be the nominal reference voltage (if no adjacent rows of the memory array have been accessed), or a modified reference voltage, if rows adjacent to the row being accessed have been accessed as well.

Figure 4:
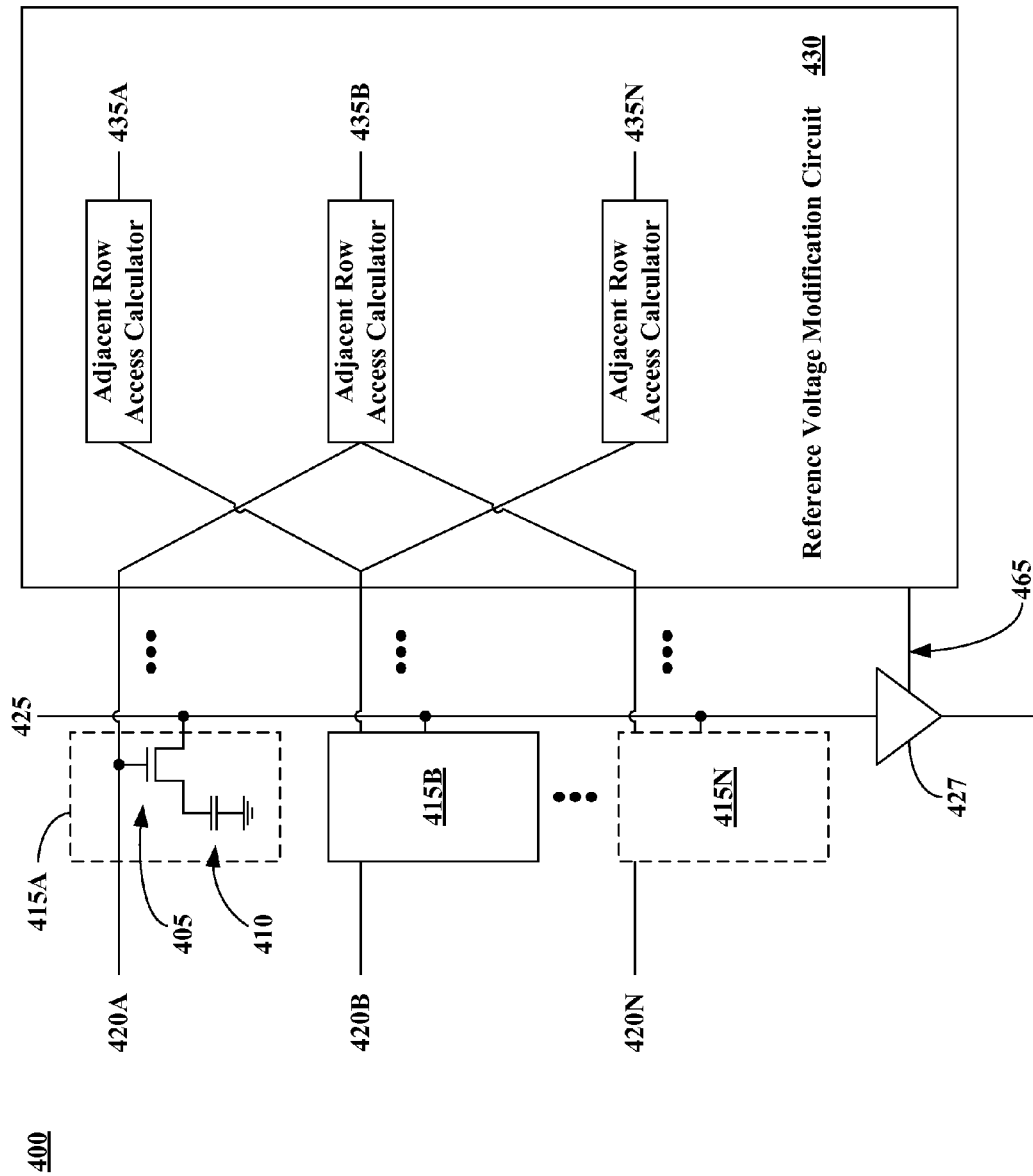
FIG. 4 illustrates a DRAM including a third embodiment of a reference voltage modification circuit.

FIG. 4 illustrates a third embodiment of a DRAM 400 including a reference voltage modification circuit, e.g., reference voltage modification circuit 430. The DRAM 400 illustrates a reference voltage modification circuit that may modify the reference voltage to be used in a sense amplifier when reading or writing a DRAM cell. In some embodiments, the reference voltage modification circuit may raise the reference voltage above the nominal reference voltage. In other embodiments, the reference voltage modification circuit 430 may lower the reference voltage below the nominal reference voltage. The modification from the nominal reference voltage may be determined by the direction of the leakage for the DRAM cells, which may vary depending upon the particular technology.

The DRAM 400 includes a plurality of DRAM cells 415A-415N, generically referred to in this Detailed Description as DRAM cells 415. Each of the DRAM cells 415 includes one transistor 405 and one capacitor 410. The capacitor 410 may be charged or discharged to represent either a 1 or a 0. The DRAM 400 is arranged in an array of DRAM cells 415. Word lines 420A-420N, generically referred to in this Detailed Description as word lines 420, connect each row. Bit lines, e.g., bit line 425, connect each column of the DRAM cells 415. The array of DRAM cells 415 including word lines 420 and bit lines 425 are exemplary and may include additional DRAM cells 415, word lines 420, and bit lines 425. Sense amplifier 427 corresponds to bit line 425. The sense amplifier 427 may be used to compare a reference voltage (provided via reference voltage line 465) with the voltage of a capacitor, e.g., capacitor 410, of one of the DRAM cells 415 to determine whether the capacitor is storing a 1 or a 0. Reference voltage modification circuit 430 provides the reference voltage 465 to the sense amplifier 427.

The reference voltage modification circuit 430 includes adjacent row access calculators 435A-435N, generically referred to in this Detailed Description as the adjacent row access calculators 435. The adjacent row access calculators 435 may be configured to calculate how susceptible a row is to losing its cell contents whenever an adjacent row is accessed. For example, every time the row connected to word line 420B is accessed the logic of adjacent row access calculators 435A and 435N are accessed. When a threshold is reached, the row will modify the reference voltage to be used in the sense amplifier 427. The logic of the adjacent row access calculator 435B is described in additional detail in accordance with FIG. 5 below.

Figure 5:
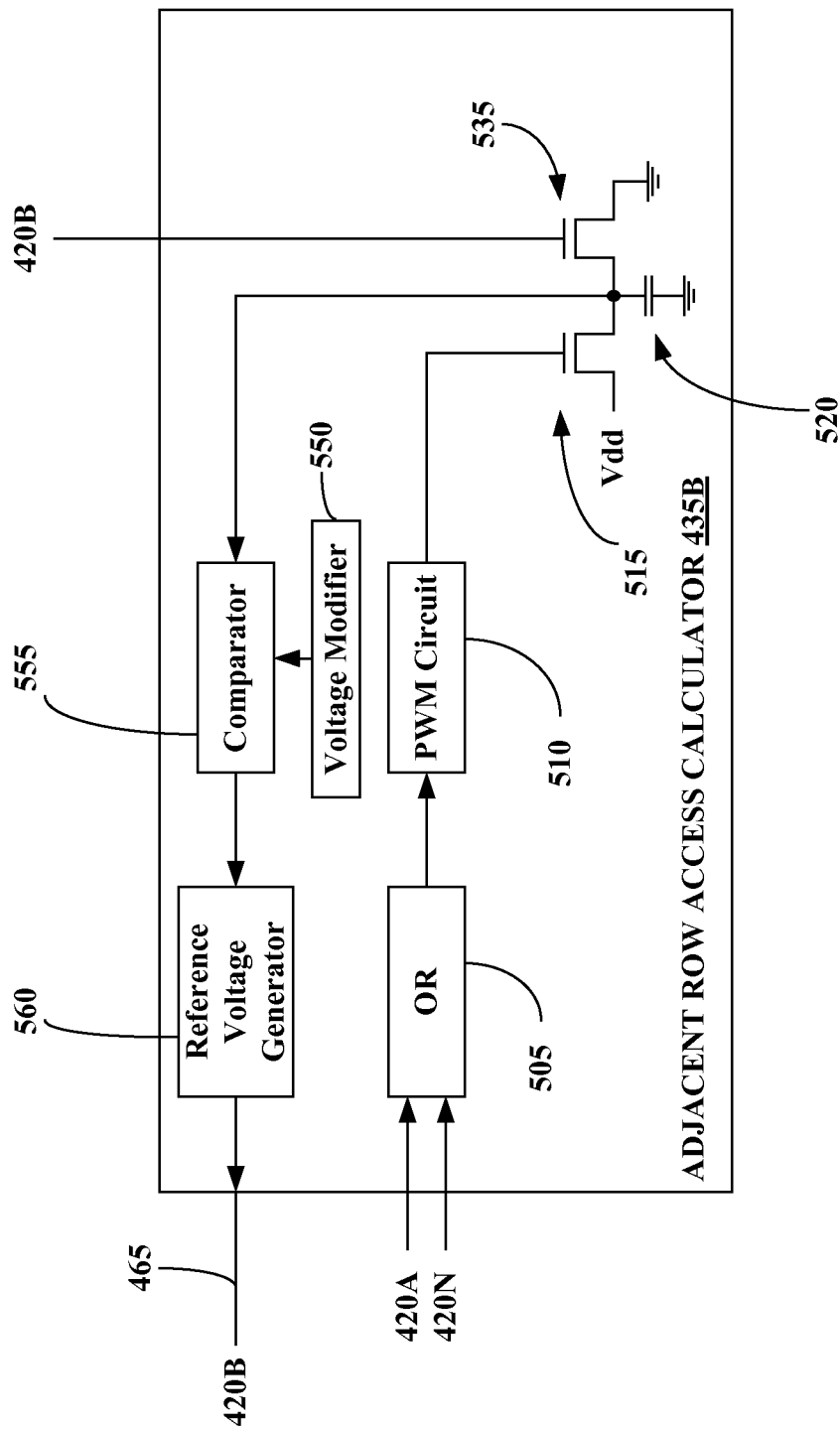
FIG. 5 illustrates a more detailed view of the adjacent row access calculator of FIG. 4, according to various embodiments.

FIG. 5 illustrates a more detailed view of the adjacent row access calculator 435B of FIG. 4, according to various embodiments. The adjacent row access calculator 435B is illustrative and may be the same as or similar to the adjacent row access calculators 435A and 435N. An OR gate 505 may receive a charge from either word line 420A or 420N, and allow the charge to be sent to a pulse width modulation circuit 510 when a row of the DRAM array connected to either word line 420A or 420N is accessed. The pulse width modulation circuit 510 may send some charge through the transistor 515 to a storage capacitor 520. The amount of the charge applied to the storage capacitor 520 from the pulse width modulation circuit 510 may be based on the rate of change of the charge in a capacitor, e.g., capacitor 410 (FIG. 4), in the corresponding DRAM cells 415, according to some embodiments. The voltage modifier 550 may provide the reference voltage line 465 a modified reference voltage in some embodiments. In other embodiments, the voltage modifier 550 may provide a voltage amount by which to modify the reference voltage. The voltage modifier 550 may include a threshold reference voltage which provides a boundary amount beyond which the reference voltage may not be modified. The comparator 555 may determine whether the charge of the storage capacitor 520 is outside a threshold. If the charge of the storage capacitor 520 is outside the threshold, then the reference voltage generator 560 may provide a modified reference voltage to the reference voltage line 465. If, however, the charge of the storage capacitor 520 is within the threshold, then the reference voltage generator 560 may provide the nominal reference voltage to the reference voltage line 465. When one of the DRAM cells 415 connected to the word line 420B is accessed, then the charge supplied to the transistor 535 will bring the charge of the storage capacitor 520 back to ground.

Figure 6:
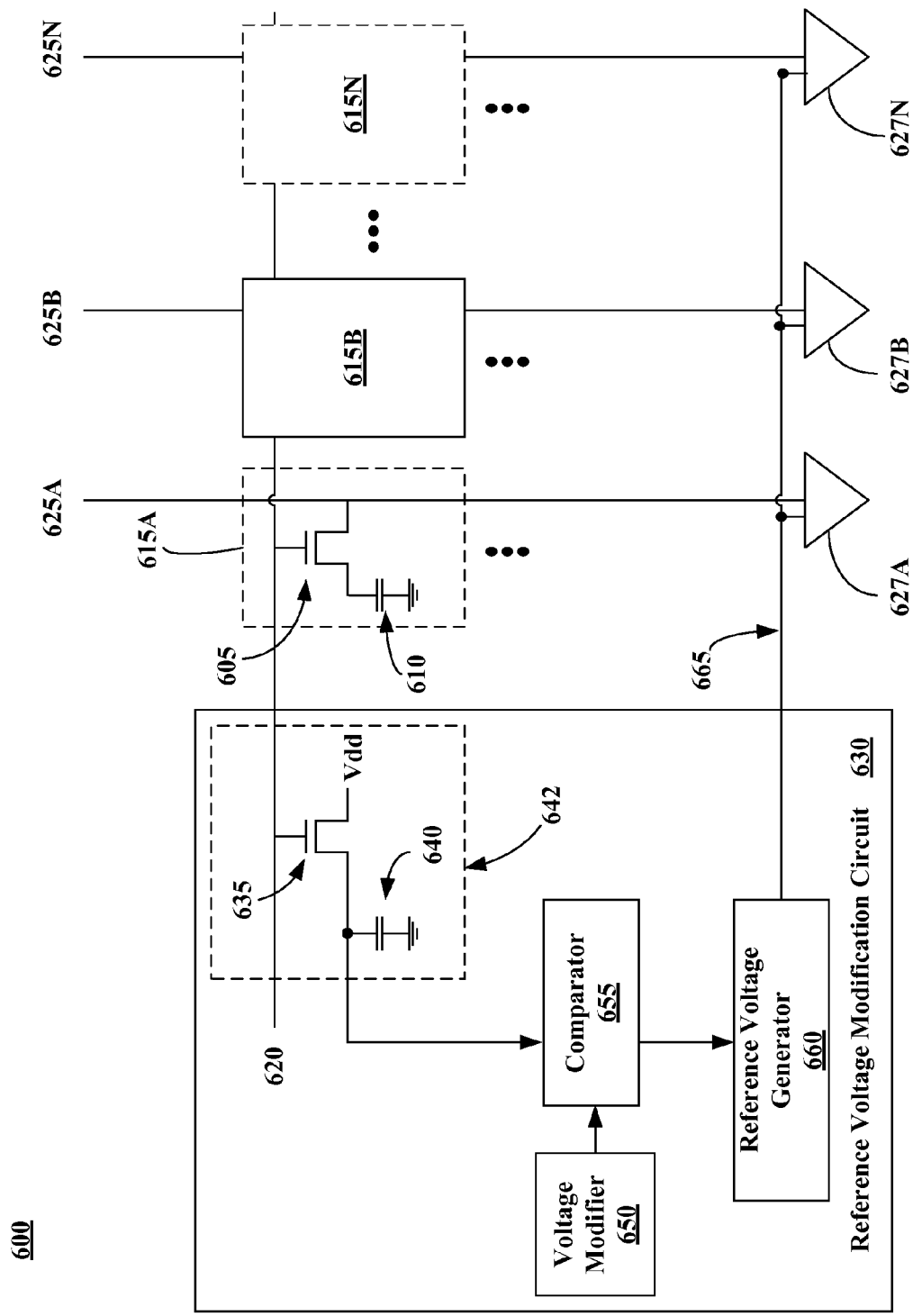
FIG. 6 illustrates a DRAM including a fourth embodiment of a reference voltage modification circuit.

FIG. 6 illustrates a fourth embodiment of a DRAM 600 including a reference voltage modification circuit, e.g., reference voltage modification circuit 630. The DRAM 600 illustrates a reference voltage modification circuit that may modify the reference voltage to be used in a sense amplifier when reading or writing a DRAM cell. In some embodiments, the reference voltage modification circuit may raise the reference voltage above the nominal reference voltage. In other embodiments, the reference voltage modification circuit may lower the reference voltage below the nominal reference voltage. The modification from the nominal reference voltage may be determined by the direction of the leakage for the DRAM cells, which may vary depending upon the particular technology.

The DRAM 600 includes a plurality of DRAM cells 615A-615N, generically referred to in this Detailed Description as DRAM cells 615. Each of the DRAM cells 615 includes one transistor 605 and one capacitor 610. The capacitor 610 may be either charged or discharged to represent either a 1 or a 0. The DRAM 600 is arranged in an array of DRAM cells 615. Word line 620 connects each row. Bit lines 625A-625N, generically referred to in this Detailed Description as bit lines 625, connect each column of the array of DRAM cells 615. The array of DRAM cells 615 including word line 620 and bit lines 625 is exemplary and may include additional DRAM cells 615, word lines 620, and bit lines 625. Sense amplifiers 627A-627N, generically referred to in this Detailed Description as sense amplifiers 627, correspond to each of the bit lines 625. The sense amplifiers 627 may be used to compare a reference voltage (provided by reference voltage line 665) with the voltage of a capacitor, e.g., capacitor 610, of one of the DRAM cells 615 to determine whether the capacitor is storing a 1 or a 0. Reference voltage modification circuit 630 may provide the reference voltage via the reference voltage line 665 to the sense amplifiers 627.

The reference voltage modification circuit 630 may include a leaky cell 642 including a transistor 635 and a capacitor 640, a voltage modifier 650, a comparator 655, and a reference voltage generator 660, according to various embodiments. The leaky cell 642 may leak charge more quickly than the DRAM cells 615. In some embodiments, the leaky cell 642 may leak charge more quickly than the DRAM cells 615 because of the design of the transistor 635. In other embodiments, the capacitor 640 may be designed to cause the leaky cell 642 to leak charge quicker than the DRAM cells 615. When a row is accessed or refreshed, e.g., the row connected to word line 620, the capacitor 640 may be charged. Because leaky cell 642 leaks charge at a rate that is more rapid than the DRAM cells 615, the leaky cell 642 may reach a threshold charge, indicating that the reference voltage may need to be modified in order to correctly determine the value stored in one of the DRAM cells 615.

The voltage modifier 650 may provide a modified reference voltage to reference voltage line 665 in some embodiments. In other embodiments, the voltage modifier 650 may provide a voltage amount by which to modify the reference voltage. The voltage modifier 650 may include a threshold reference voltage which provides a boundary amount beyond which the reference voltage may not be modified. The comparator 655 may determine whether the charge in the leaky cell 642 is below the threshold charge. If the charge in the leaky cell 642 falls below the threshold charge then the reference voltage generator 660 may provide a modified reference voltage to the reference voltage line 665. If, however, the charge in the leaky cell 642 does not fall below the threshold then the reference voltage generator 660 may provide the nominal reference voltage to the reference voltage line 665.

Figure 7:
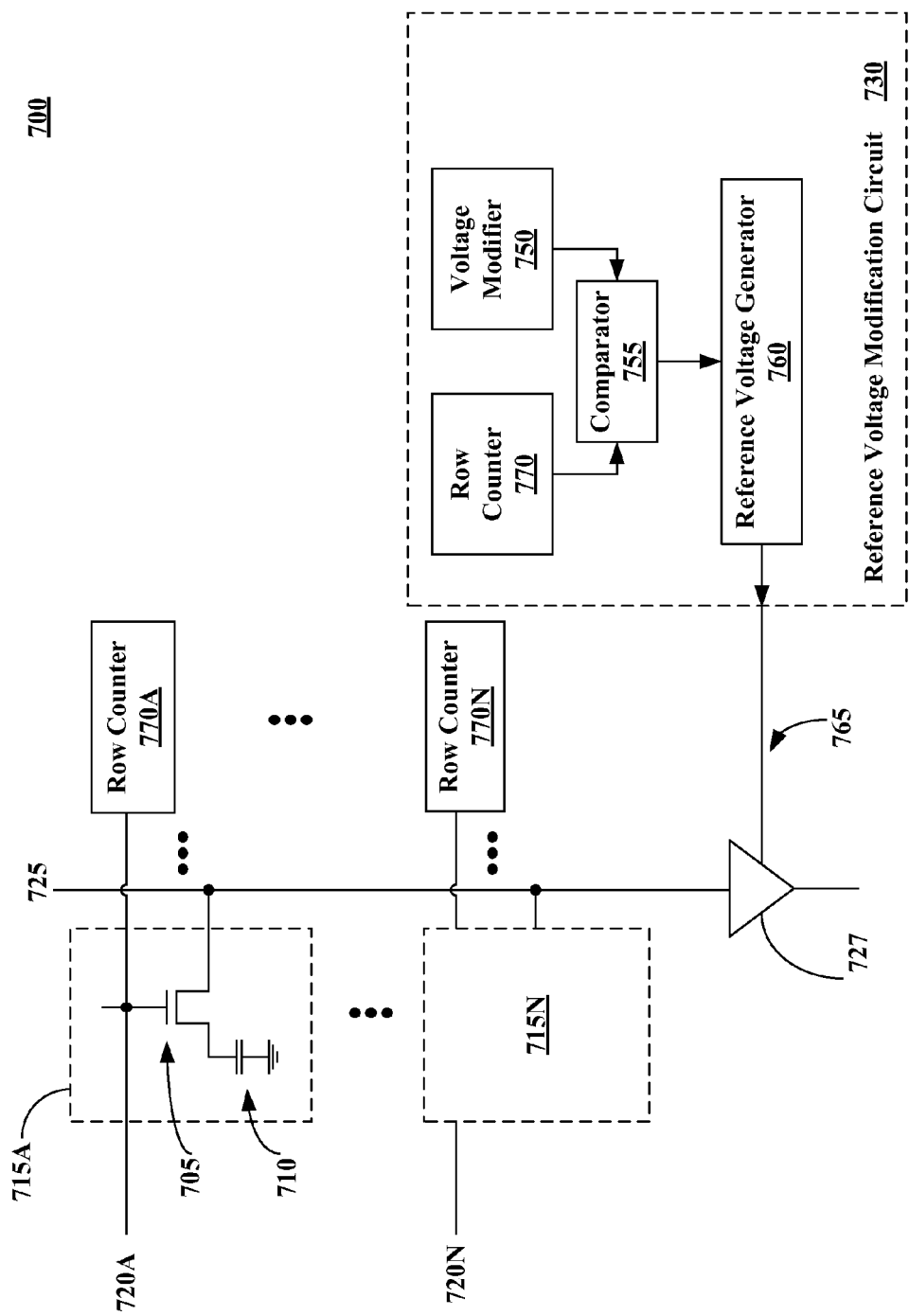
FIG. 7 illustrates a DRAM including a fifth embodiment of a reference voltage modification circuit.

FIG. 7 illustrates a fifth embodiment of a DRAM 700 including a reference voltage modification circuit, e.g., reference voltage modification circuit 730. The DRAM 700 illustrates a reference voltage modification circuit that may modify the reference voltage to be used in a sense amplifier when reading or writing a DRAM cell. In some embodiments, the reference voltage modification circuit may raise the reference voltage above the nominal reference voltage. In other embodiments, the reference voltage modification circuit 730 may lower the reference voltage below the nominal reference voltage. The modification from the nominal reference voltage may be determined by the direction of the leakage for the DRAM cells, which may vary depending upon the particular technology.

The DRAM 700 includes a plurality of DRAM cells 715A-715N, generically referred to in this Detailed Description as DRAM cells 715. Each of the DRAM cells 715 includes one transistor 705 and one capacitor 710. The capacitor 710 may be charged or discharged to represent either a 1 or a 0. The DRAM 700 is arranged in an array of DRAM cells 715. Word lines 720A-720N, generically referred to in this Detailed Description as word lines 720, connect each row. Each row of the memory array contains a row counter, e.g., row counter 770A connected to word line 720A, configured to determine how much time has elapsed since the last refresh to the particular row. When a row is accessed or refreshed, the corresponding row counter may be reset. Though the row counters 770 are illustrated as being part of the DRAM 700, the row counters could reside in the logic chip of a through-silicon via (TSV) instead of on the DRAM 700 in other embodiments. Bit lines, such as bit line 725, connect each column of the array of DRAM cells 715. The array of DRAM cells 715 including word lines 720 and word lines 725 are exemplary and may include additional DRAM cells 715, word lines 720, and bit lines 725. Sense amplifier 727 corresponds to bit line 725. The sense amplifier 727 may be used to compare a reference voltage provided by reference voltage line 765 with the voltage of a capacitor, e.g., capacitor 710, of one of the DRAM cells 715 to determine whether the capacitor is storing a 1 or a 0. Reference voltage modification circuit 730 provides the reference voltage to the sense amplifier 727 via the reference voltage line 765.

The reference voltage modification circuit 730 may include a row counter 770, a voltage modifier 750, a comparator 755, and a reference voltage generator 760, according to various embodiments. The row counter 770 may indicate how much time has elapsed since the particular row was last refreshed. The voltage modifier 750 may provide a modified reference voltage in some embodiments. In other embodiments, the voltage modifier 750 may provide an amount by which to modify the reference voltage 765. The voltage modifier 750 may include a threshold for the reference voltage which provides a boundary amount beyond which the reference voltage may not be modified. The comparator 755 may determine whether the time that has elapsed since the last refresh to the particular row is outside a refresh time threshold. If the time elapsed since the last refresh is determined to be outside the refresh time threshold, the reference voltage generator 760 may provide a reference voltage to reference voltage line 765 that has been modified from the nominal reference voltage. If, however, the time elapsed since the last refresh is within the refresh time threshold, then the reference voltage generator 760 may provide the nominal reference voltage to the reference voltage line 765.

While the Detailed Description may refer to specific types of transistors, logic gates, supply voltages, and the like, one skilled in the art may implement the same or similar functions using different transistors, logic gates, and supply voltages in alternative aspects as described and still accomplish the same purpose of this disclosure. For example, transistors may be PFETs or NFETs. Logic gates may be AND, OR, XOR, NOR, NAND, XNOR or inverters.

The terminology used in this Specification is for the purpose of describing particular embodiments only and is not intended to be limiting. The singular forms "a," "an," and "the" are intended to include the plural forms as well, unless the context clearly indicates otherwise. When used in this Specification, the terms "includes" and/or "including," specify the presence of the stated features, integers, steps, operations, elements, and/or components, but do not preclude the presence or addition of one or more other features, integers, steps, operations, elements, components, and/or groups thereof.

In the previous Detailed Description, reference was made to the accompanying drawings (where like numbers represent like elements), which form a part hereof, and in which is shown by way of illustration specific exemplary embodiments in which the embodiments may be practiced. These embodiments were described to enable those skilled in the art to practice the embodiments, but other embodiments may be utilized and logical, mechanical, electrical, and other changes may be made without departing from the scope of the present disclosure. In the previous Detailed Description, numerous specific details were set forth to provide a thorough understanding of embodiments. Embodiments, however, may be practiced without these specific details. In other instances, well-known circuits, structures, and techniques have not been shown in detail in order not to obscure embodiments.

Different instances of the word "embodiment" as used within this Specification may, but do not necessarily, refer to the same embodiment. While the foregoing is directed to exemplary embodiments, other and further embodiments of the disclosure may be devised without departing from the basic scope thereof, and the scope thereof is determined by the claims that follow.

What is claimed is:

1. A method comprising:
   determining whether an access to a first row of a memory array has occurred, the first row of the memory array adjacent to at least a second row of the memory array;
   detecting a triggering event, wherein the triggering event is based on a voltage indicator corresponding to the second row of the memory array; and
   modifying a reference voltage to be used for accessing the second row of the memory array in response to detecting the triggering event.

2. The method of claim 1, wherein the voltage indicator is based on whether an access to the first row of the memory array has occurred.

3. The method of claim 1, wherein the triggering event is detected when a number of accesses to the first row of the memory array is outside a threshold.

4. The method of claim 1, further comprising:
   resetting a number of accesses to the first row of the memory array when at least one of an access to the second row of the memory array occurs and a refresh of the second row of the memory array occurs.

5. The method of claim 4, further comprising:
   resetting the reference voltage.

6. A method comprising:
   determining whether a request to access a row of a memory array has been received;
   determining a time elapsed since a last refresh for the row of the memory array;
   detecting a triggering event, wherein the triggering event is based on time; and
   modifying a reference voltage to be used to access the row of the memory array in response to detecting a triggering event.

7. The method of claim 6, wherein the triggering event is detected when the time elapsed since the last refresh for the row is outside a threshold and a request to access the row has been received.

8. The method of claim 7, further comprising:
   providing an unmodified reference voltage when the time elapsed since the last refresh for the row is within the threshold.

9. The method of claim 6, further comprising:
   resetting the reference voltage when a refresh occurs.

10. The method of claim 6, further comprising:
    resetting the reference voltage when an access to the row of the memory array occurs.

11. A method comprising:
    determining whether an access to a first row of a memory array has occurred, the first row of the memory array adjacent to at least a second row of the memory array;
    detecting a triggering event, wherein the triggering event is based on a plurality of row accesses;
    modifying a reference voltage to be used for accessing the second row of the memory array in response to detecting a triggering event;
    resetting a number of accesses to the first row of the memory array when at least one of an access to the second row of the memory array occurs and a refresh of the second row of the memory array occurs; and
    resetting the reference voltage.

* * * * *